(12) United States Patent
Searls et al.

(10) Patent No.: US 6,913,999 B2
(45) Date of Patent: Jul. 5, 2005

(54) SEMICONDUCTOR DEVICE WITH COMPONENTS EMBEDDED IN BACKSIDE DIAMOND LAYER

(75) Inventors: Damion T. Searls, Portland, OR (US); Prateek J. Dujari, Portland, OR (US); Bin Lian, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/670,025

(22) Filed: Sep. 24, 2003

(65) Prior Publication Data

US 2004/0056272 A1 Mar. 25, 2004

Related U.S. Application Data

(62) Division of application No. 10/109,143, filed on Mar. 26, 2002, now Pat. No. 6,649,937.

(51) Int. Cl.[7] .............................................. H01L 21/44
(52) U.S. Cl. ..................... 438/667; 438/122; 438/778
(58) Field of Search ................................ 438/122, 667, 438/778

(56) References Cited

U.S. PATENT DOCUMENTS

| 5,391,914 | A | 2/1995 | Sullivan et al. |
| 5,682,063 | A | 10/1997 | Yamamoto et al. |
| 5,683,939 | A | 11/1997 | Schrantz et al. |
| 6,075,712 | A | 6/2000 | McMahon |
| 6,509,124 | B1 * | 1/2003 | Noguchi et al. ............... 430/5 |
| 6,621,535 | B1 * | 9/2003 | Fukada ....................... 349/40 |

FOREIGN PATENT DOCUMENTS

WO  PCT/US 03/08592  3/2003

* cited by examiner

Primary Examiner—George Fourson
Assistant Examiner—Michelle Estrada
(74) Attorney, Agent, or Firm—Kenneth J. Cool

(57) ABSTRACT

A semiconductor substrate with integrated circuit devices on its front side and a high thermal conductivity layer such as diamond on its back side, with components such as capacitors embedded in the high thermal conductivity layer and coupled to the front side integrated circuits with vias through the substrate.

17 Claims, 5 Drawing Sheets

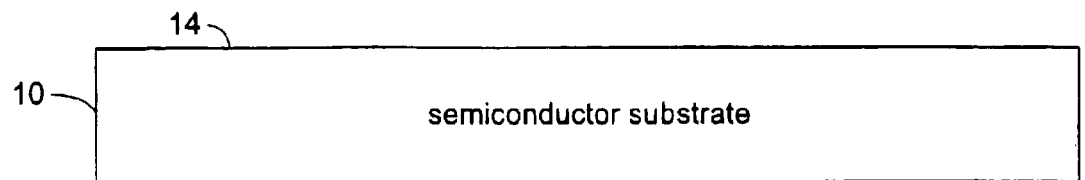
Fig. 1 - prior art
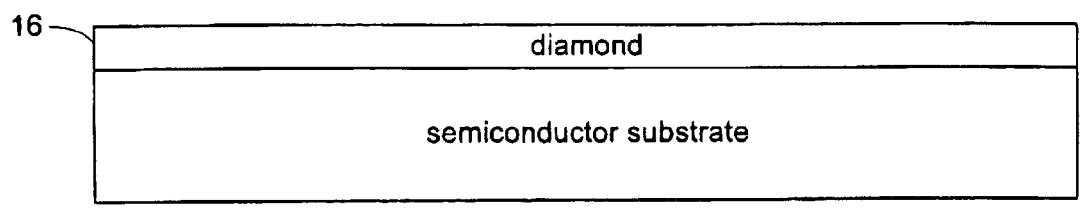
Fig. 2 - prior art
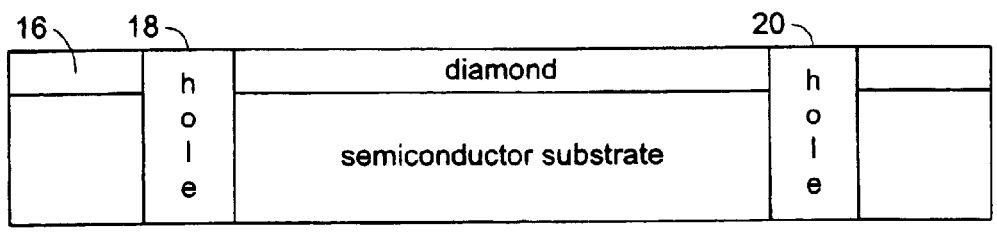
Fig. 3
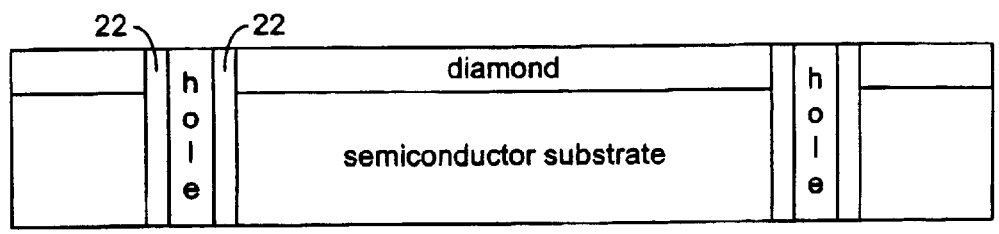
Fig. 4
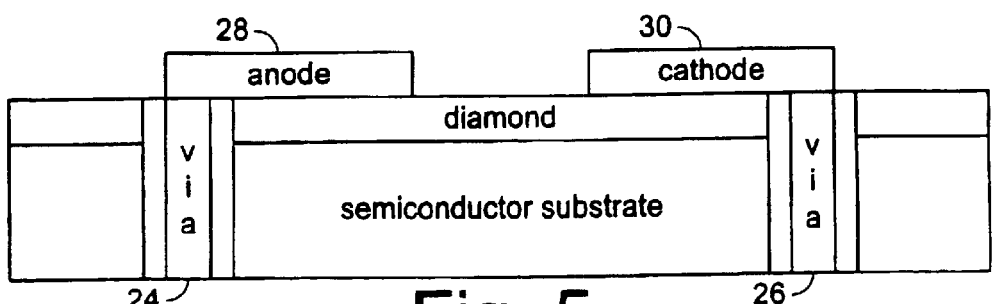
Fig. 5

SEMICONDUCTOR DEVICE WITH COMPONENTS EMBEDDED IN BACKSIDE DIAMOND LAYER

This patent application is a Divisional Application of U.S. patent application Ser. No. 10/109,143, entitled "Semiconductor Device with Components Embedded in Backside Diamond Layer", filed Mar. 26, 2002 now U.S. Pat. No. 6,649,937.

BACKGROUND OF THE INVENTION

1. Technical Field of the Invention

This invention relates generally to semiconductor devices, and more specifically to a semiconductor device having a backside layer of high thermal conductivity, low electrical conductivity material in which are embedded one or more components such as capacitors.

2. Background Art

Semiconductor devices include components such as transistors fabricated on the "front side" of a silicon or other semiconductor die, such as that of FIG. 1. Recently, it has become known to fabricate a layer of high thermal conductivity material on the "back side" of the die, to improve thermal conductivity from the die to a heat sink or other thermal solution coupled to the back side of the die, such as that of FIG. 2. Diamond is one especially advantageous material for this purpose, because of its unusually high thermal conductivity of approximately 2,300 W/mK.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

FIG. 1 shows a semiconductor substrate (die or wafer) such as is known in the prior art.

FIG. 2 shows a semiconductor substrate having a layer of high thermal conductivity material such as diamond deposited on the back side of the substrate, as is known in the prior art.

FIGS. 3–7 show various stages in the fabrication of a device according to this invention.

DETAILED DESCRIPTION

Figure 6:
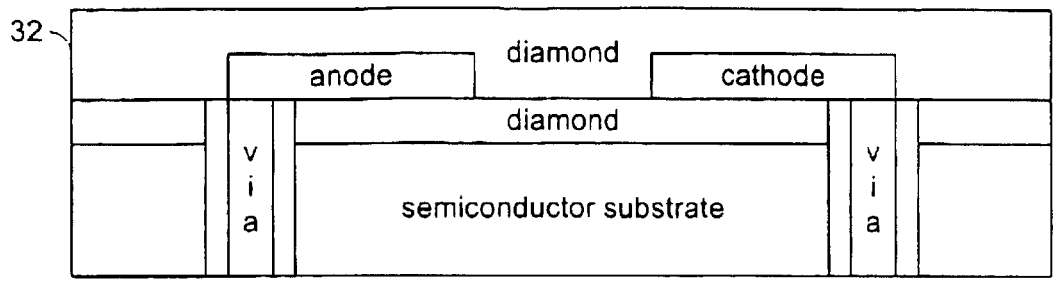

FIGS. 1–7 illustrate one exemplary embodiment of a method of manufacturing a structure according to this invention, and the resulting structure.

FIG. 1 shows a semiconductor substrate 10 such as silicon, gallium arsenide, or other suitable wafer or die material, hereinafter referred to simply as the die. The die has a front side 12 and a back side 14.

FIG. 2 shows a layer 16 of high thermal conductivity, low electrical conductivity material deposited on the back side of the die. In one embodiment of the invention, this layer is made by chemical vapor deposition of diamond. Diamond is one especially advantageous material for use in practicing this invention, because of its high thermal conductivity of around 2,300 W/mK, its high electrical resistivity of around $10^{16}$ $\Omega$-cm, and its high band gap of around 5.5 eV. Although diamond has a relatively low dielectric constant of around 5.5–10, its high dielectric strength of around 1.0 E5 V/mm can compensate for this by enabling smaller capacitive structures than would be possible with a material having a lower dielectric strength.

In some embodiments, the relatively strong and stiff diamond layer may enable polishing the die back to a relatively thin size. This can facilitate having a relatively thick diamond layer without increasing the overall thickness of the structure.

FIG. 3 shows a plurality of holes 18, 20 formed through the structure. In many embodiments, it will be desirable that these holes extend all the way through the structure. They can be formed by any suitable process, such as by laser drilling through the diamond and etching through the silicon, or laser drilling through the entire structure, or the like.

FIG. 4 shows the holes' inner surface having been lined with an electrically insulative material 22 such as silicon dioxide.

FIG. 5 shows electrically conductive interconnects 24, 26 formed in the holes, and insulated from the semiconductor substrate by the insulative material lining the holes. These interconnects or "vias" provide electrical connection between components that will be formed on the front side of the die, and components that will be formed on the back side of the die.

Various components can be formed on the back side, such as capacitors, resistors, inductors, or even active components. For purposes of illustration, FIGS. 5–7 will illustrate the formation of a capacitor, but the reader will appreciate that the invention is not so limited. An anode 28 of the capacitor is fabricated so as to be in electrical contact with one via 24, and a cathode 30 of the capacitor is fabricated so as to be in electrical contact with another via 26.

FIG. 6 shows the addition of more of the diamond or other insulative material 32, to encapsulate the anode and the cathode and insulate them from exterior structures and components.

Figure 7:
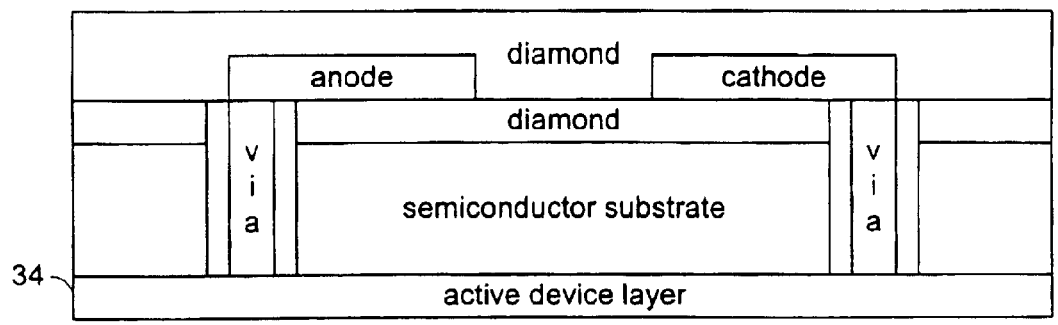

FIG. 7 shows the formation of one or more active device layers 34 on the front side of the die. The active device layer will typically contain many active and passive components (not shown), some of which will be fabricated so as to be in electrical contact, through the vias, to the back side components such as the capacitor shown. In some embodiments, it may be desirable to polish or planarize the front side of the die at some point before FIG. 7, before fabricating the active device layers.

Figure 8:
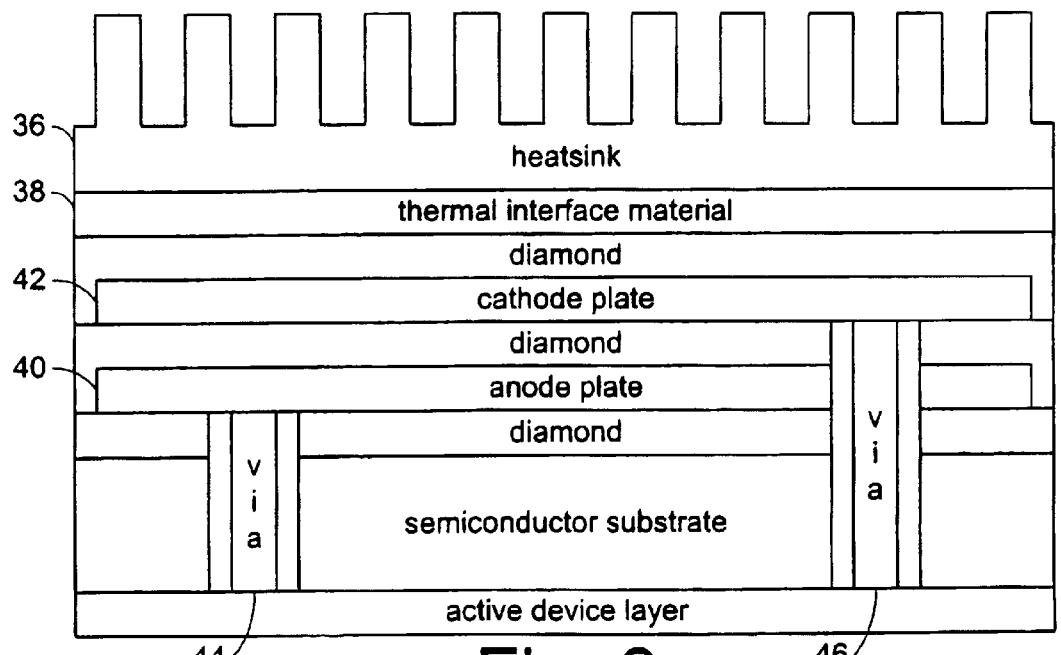
FIG. 8 shows an alternative embodiment of the invention, together with a thermal solution.

FIG. 8 shows the addition of a thermal solution 36 such as a heat sink to the back side of the structure, typically with a layer of suitable thermal interface material 38 which improves contact between the surface of the outer diamond layer and the opposing surface of the heat sink.

FIG. 8 also shows an alternative embodiment of the invention, in which two or more component layers are sandwiched between three or more diamond layers. One example of such a structure is a capacitor in which one of the anode 40 and the cathode 42 overlies the other, rather than the anode and cathode residing on the same layer as in FIG. 7. This configuration may allow for very large surface areas of an anode plate and a cathode plate. The vias 44, 46 which connect to the anode and cathode, respectively, will be of different length, with one of them passing through and insulated from the other's plate.

Figure 9:
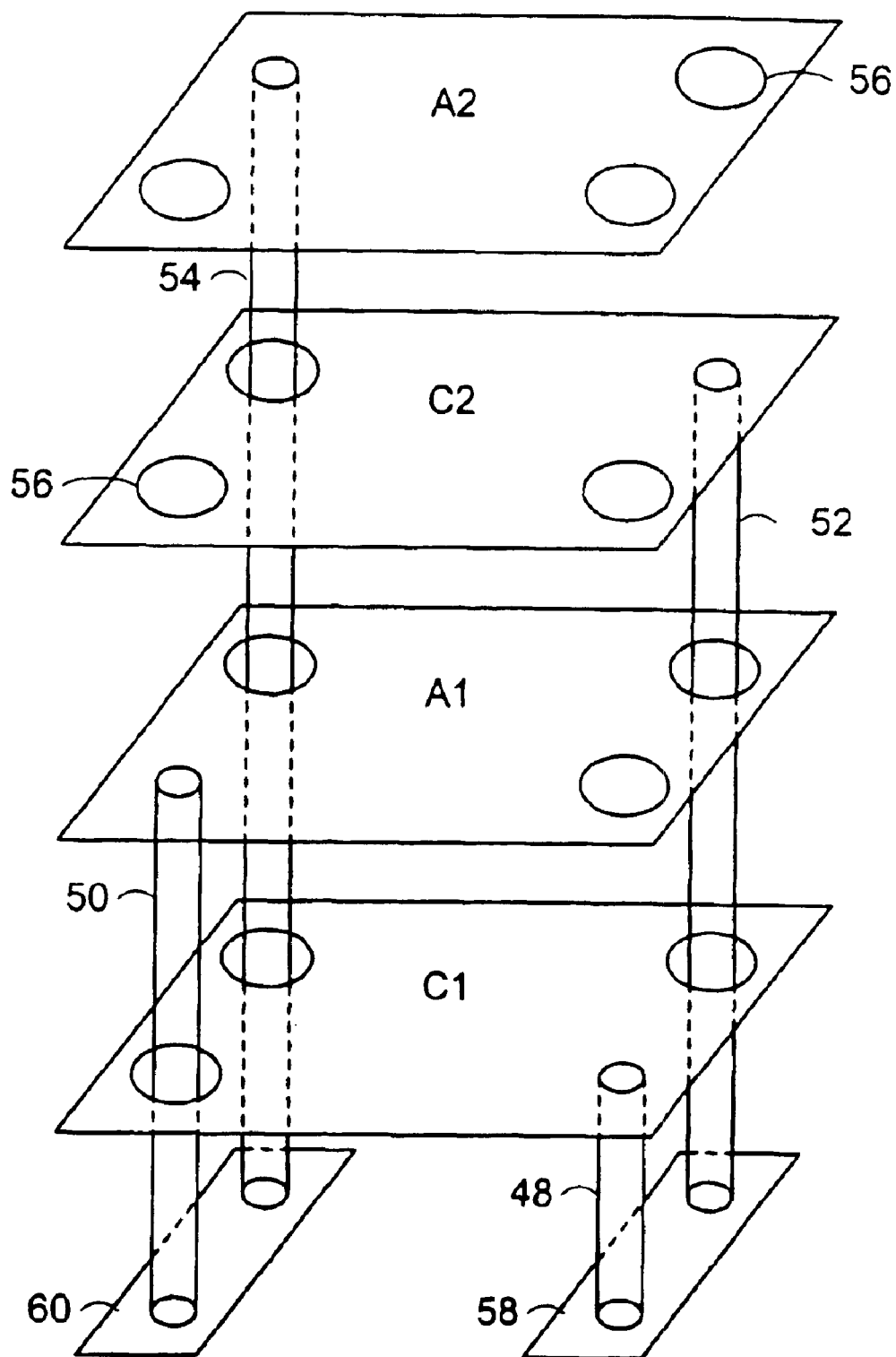
FIG. 9 shows an alternative capacitor structure which may be used in conjunction with this invention.

FIG. 9 shows another embodiment of the multiple-layer structure, illustrating again the example of a capacitor. The diamond and other layers are omitted for the sake of illustration. As in the other figures, the front side of the die should be understood to be downward in the drawing. A first capacitor includes a cathode plate C1 and an anode plate A1. A second capacitor overlies the first, and includes a cathode plate C2 and an anode plate A2.

A first via 48 connects to the first capacitor's cathode. A second via 50 connects to the first capacitor's anode and passes through a hole in the first capacitor's cathode. A third via 52 connects to the second capacitor's cathode and passes through holes in the first capacitor's cathode and anode. A fourth via 54 connects to the second capacitor's anode and passes through holes in the first capacitor's cathode and anode and the second capacitor's cathode.

In some embodiments, it may be desirable to construct dummy holes 56 in various of the cathodes and anodes, to equalize the surface areas of the anodes and cathodes, and so forth.

The active component layers, or in some embodiments the back side, may be equipped with a cathode bus bar 58 an anode bus bar 60 to which the various cathodes and anodes are respectively coupled, to provide parallel connection to the various capacitors, effectively yielding one larger capacitor.

The reader will appreciate that the numbers of back side component layers, and what is constructed in each, can be varied according to the needs of the application at hand, and that the examples shown are for illustration only, and are not by way of limitation.

Figure 10:
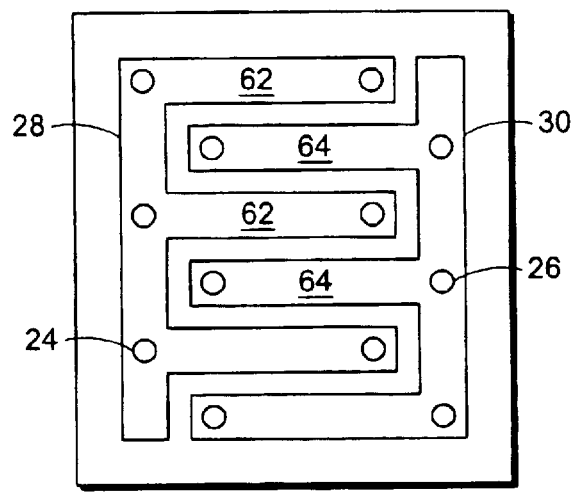
FIGS. 10–11 show more alternative embodiments of capacitor structures which may be used in conjunction with this invention.

FIG. 10 illustrates one embodiment of a capacitor structure which may be fabricated within a single back side component layer, such as that shown in FIG. 7. The capacitor includes an anode 28 which has fingers 62 which are interlaces with the fingers 64 of the cathode 30. A first set of vias 24 connects to the anode, and a second set of vias 26 connects to the cathode. The skilled reader will appreciate that the vias are sized and spaced, and that the number, dimensions, spacing, and interlacing of the fingers are selected, according to the needs of the application at hand.

Figure 11:
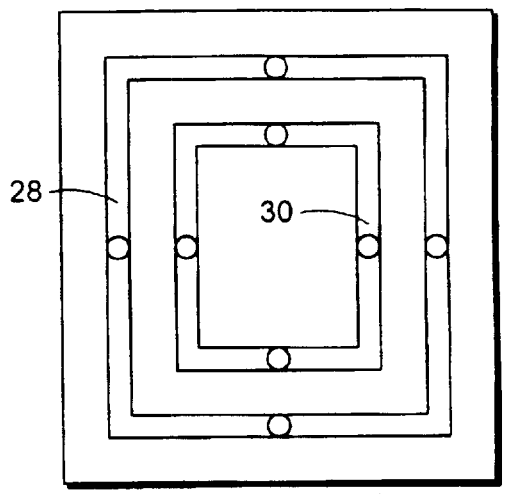

FIG. 11 illustrates an alternative embodiment of a capacitor, in which the anode 28 and the cathode 30 are constructed as concentric rings or rectangles bearing first vias and second vias, respectively.

Figure 12:
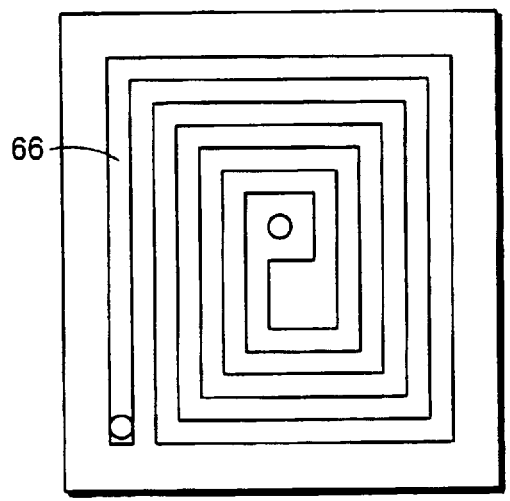
FIG. 12 shows an inductor structure which may be used in conjunction with this invention.

FIG. 12 illustrates one example of an inductor 66 which can be formed within the back side diamond layers as a circular or rectangular or other suitable spiral of conductive material, with a pair of vias generally located at respective ends of the spiral.

Figure 13:
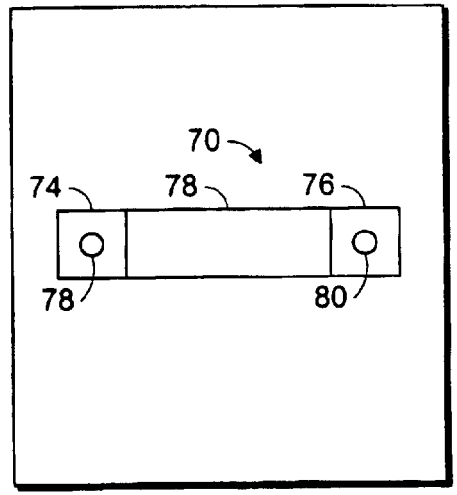
FIG. 13 shows a resistor structure which may be used in conjunction with this invention.

FIG. 13 illustrates one example of a resistor 72 which may be formed within the back side diamond layers. The resistor includes a first terminal 74 and a second terminal 76 coupled, respectively, to a first via 78 and a second via 80, and connected by a segment 82 of suitably sized and selected electrically resistive material.

Figure 14:
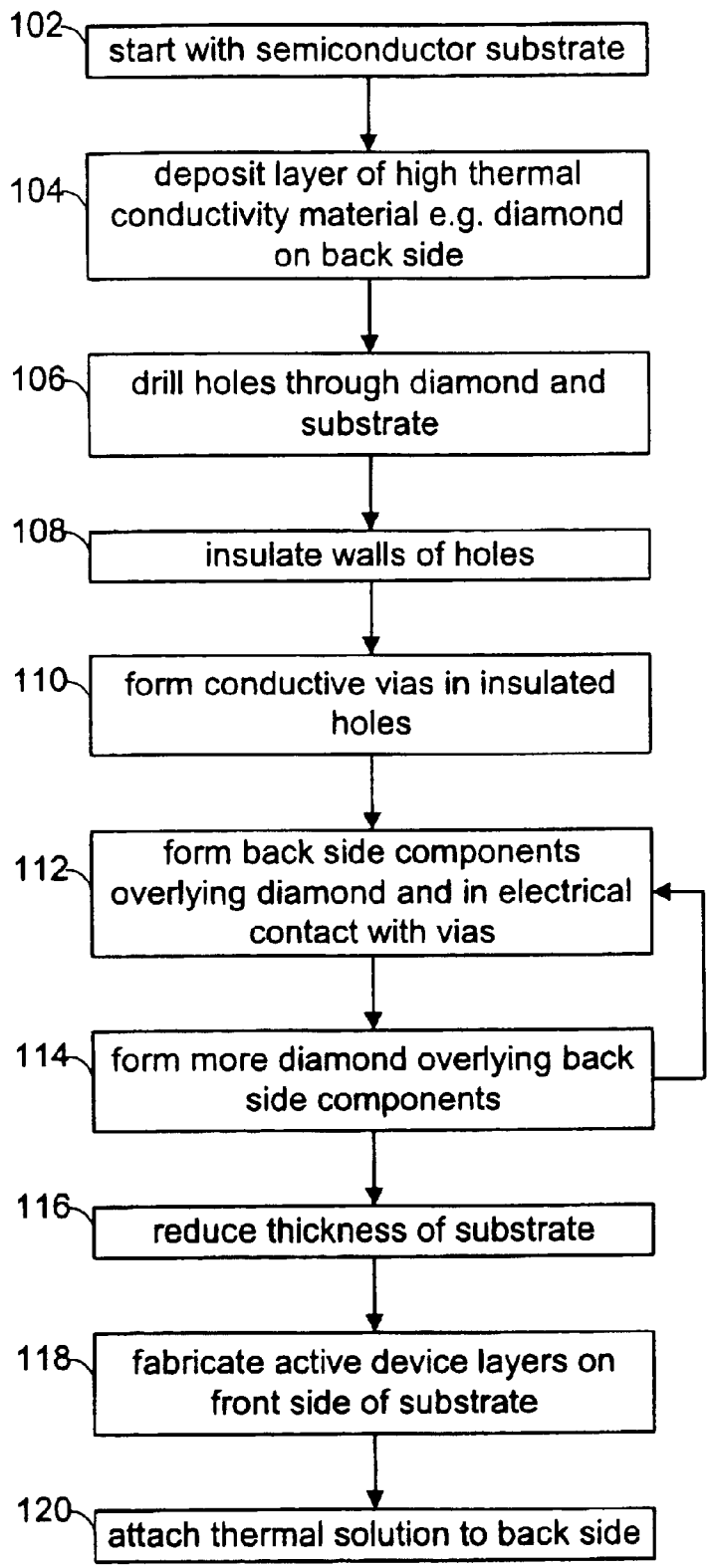
FIG. 14 shows an exemplary method of fabrication of the invention.

FIG. 14 illustrates one exemplary method 100 of manufacturing a semiconductor assembly according to this invention. Manufacturing starts (102) with a semiconductor substrate such as a wafer of silicon. A layer of high thermal conductivity material such as diamond is deposited (104) on the back side of the semiconductor substrate. Holes are drilled (106) or otherwise formed through the diamond and the substrate, and are insulated (108). Vias are formed (110) in the insulated holes. Back side components such as capacitors are formed (112) overlying the diamond, and in electrical connection with the vias. More diamond is deposited (114) overlying the earlier deposited diamond and the back side components. Optionally, the process of forming back side components and encapsulating them in diamond can be repeated. Optionally, the thickness of the semiconductor substrate can be reduced (116) if desired. Active devices are fabricated (118) on the front side of the semiconductor substrate. A thermal solution such as a heat sink is attached (120) to the back side, such as by connecting it to the diamond layer with a layer of thermal interface material.

The reader will appreciate that, at various stages, it may be desirable to form lateral interconnects, to couple various ones of the back side components into networks, to extend vias or form new vias that are only on the back side, and so forth.

The reader will appreciate, after reading this patent, that a wide variety of back side components may be constructed within the limits of, and according to the teachings of, this patent. These components may be constructed as generally two-dimensional structures within a single component layer on the back side, or they may be constructed as three-dimensional structures within two or more component layers on the back side. In some embodiments, it may be desirable to fabricate some of their parts on the front side, as well. They may be constructed as discrete components, each having its own set of vias for connection to the front side, or they may be constructed as integrated component groups sharing sets of vias.

They may include only passive components, or they may include both passive and active components, or they may include only active components. However, it will be necessary that any active components be able to survive subsequent portions of the back side fabrication process. For example, chemical vapor deposition of diamond is generally performed at temperatures of around 600° C.

Materials other than diamond may be utilized as the high thermal conductivity, low electrical conductivity layers on the back side, but diamond is an especially well-suited material, as indicated above. Suitable materials will generally have thermal conductivity greater than 150 W/mK, electrical resistivity greater than 1.0 E9 Ω-cm, and a dielectric constant above 5.0.

The reader will appreciate that the drawings are by way of illustration only, and that not every aspect of the structure has been shown, for the sake of illustration of the broader principles of the invention. For example, it will often be the case that additional fabrication techniques may need to be employed, such as polishing, planarizing, annealing, cleaning, and so forth.

The reader should appreciate that drawings showing methods, and the written descriptions thereof, should also be understood to illustrate machine-accessible media having recorded, encoded, or otherwise embodied therein instructions, functions, routines, control codes, firmware, software, or the like, which, when accessed, read, executed, loaded into, or otherwise utilized by a machine, will cause the machine to perform the illustrated methods. Such media may include, by way of illustration only and not limitation:

magnetic, optical, magneto-optical, or other storage mechanisms, fixed or removable discs, drives, tapes, semiconductor memories, organic memories, CD-ROM, CD-R, CD-RW, DVD-ROM, DVD-R, DVD-RW, Zip, floppy, cassette, reel-to-reel, or the like. They may alternatively include down-the-wire, broadcast, or other delivery mechanisms such as Internet, local area network, wide area network, wireless, cellular, cable, laser, satellite, microwave, or other suitable carrier means, over which the instructions etc. may be delivered in the form of packets, serial data, parallel data, or other suitable format. The machine may include, by way of illustration only and not limitation: microprocessor, embedded controller, PLA, PAL, FPGA, ASIC, computer, smart card, networking equipment, or any other machine, apparatus, system, or the like which is adapted to perform functionality defined by such instructions or the like. Such drawings, written descriptions, and corresponding claims may variously be understood as representing the instructions etc. taken alone, the instructions etc. as organized in their particular packet/serial/parallel/etc. form, and/or the instructions etc. together with their storage or carrier media. The reader will further appreciate that such instructions etc. may be recorded or carried in compressed, encrypted, or otherwise encoded format without departing from the scope of this patent, even if the instructions etc. must be decrypted, decompressed, compiled, interpreted, or otherwise manipulated prior to their execution or other utilization by the machine.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. A method of manufacturing a semiconductor device, the method comprising:

forming a first layer of high thermal conductivity material on a back side of a semiconductor substrate;

forming a hole through the first layer of high thermal conductivity material and the semiconductor substrate;

forming a via in the hole;

forming a first device overlying the layer of high thermal conductivity material on the back side of the semiconductor substrate and in electrical connection with the via;

forming a second layer of high thermal conductivity material overlying the first device; and forming a second device on a front side of the semiconductor substrate and in electrical connection with the via.

2. The method of claim 1 further comprising:

coupling a thermal solution to the second layer of high thermal conductivity material.

3. The method of claim 2 wherein the thermal solution comprises a heat sink and coupling the heat sink to the second layer of high thermal conductivity material comprises placing a layer of thermal interface material between the heat sink and the second layer of high thermal conductivity material.

4. The method of claim 1 wherein forming the first device comprises:

forming an anode and a cathode, and the first device comprises a capacitor.

5. The method of claim 4 wherein forming the anode and the cathode comprises:

fabricating the anode and the cathode to each have a plurality of fingers interlaced with fingers of the other.

6. The method of claim 4 wherein forming the anode and the cathode comprises:

forming the anode as a plate and forming the cathode as a plate, one of the plates overlying the other; and forming a middle layer of high thermal conductivity material between the plates.

7. The method of claim 1 wherein the high thermal conductivity material comprises diamond.

8. The method of claim 7 wherein forming the layers of diamond comprises chemical vapor deposition.

9. The method of claim 1 further comprising, after forming the second layer of high thermal conductivity material and before forming the second device on the front side:

reducing a thickness of the semiconductor substrate.

10. The method of claim 1 wherein:

forming the hole comprises forming a plurality of holes;

forming the via comprises forming a plurality of vias in respective holes; and forming the first device comprises forming a plurality of devices in electrical connection with respective subsets of the vias.

11. The method of claim 1 wherein forming the first device comprises:

fabricating a spiral inductor.

12. The method of claim 1 wherein forming the first device comprises:

fabricating a resistor.

13. The method of claim 1 wherein the high thermal conductivity material has a thermal conductivity greater than 150 W/mK.

14. The method of claim 13 wherein the high thermal conductivity material has a thermal conductivity greater than 2000 W/mK.

15. The method of claim 13 wherein the high thermal conductivity material has an electrical resistivity greater than 1 E9 Ω-cm.

16. The method of claim 15 wherein the high thermal conductivity material has a thermal conductivity greater than 2000 W/mK.

17. The method of claim 16 wherein the high thermal conductivity material has an electrical resistivity greater than 1 E15 Ω-cm.

* * * * *